(12) United States Patent
Son et al.

(10) Patent No.: US 11,023,063 B2
(45) Date of Patent: Jun. 1, 2021

(54) TOUCH SENSOR AND DISPLAY DEVICE INCLUDING THE SAME

(71) Applicant: Samsung Display Co., Ltd., Yongin-Si (KR)

(72) Inventors: Se Wan Son, Yongin-si (KR); Moo Soon Ko, Yongin-si (KR); Jung Hwa Kim, Yongin-si (KR); Jin Sung An, Yongin-si (KR); Seong Jun Lee, Yongin-si (KR); Wang Woo Lee, Yongin-si (KR); Ji Seon Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/700,567

(22) Filed: Dec. 2, 2019

(65) Prior Publication Data

US 2020/0104002 A1    Apr. 2, 2020

Related U.S. Application Data

(63) Continuation of application No. 15/983,427, filed on May 18, 2018, now Pat. No. 10,496,206.

(30) Foreign Application Priority Data

May 24, 2017    (KR) .................. 10-2017-0064114

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/047* (2013.01); *G06F 3/0416* (2013.01);
(Continued)

(58) Field of Classification Search
CPC ...... G06F 3/0412; G06F 3/0416; G06F 3/044; G06F 3/047; G06F 2203/04112; G09G 3/3258; H01L 27/3276; G06K 9/0002
See application file for complete search history.

(56) References Cited

U.S. PATENT DOCUMENTS

| 7,884,810 B2 | 2/2011 | Jang et al. |
| 9,257,563 B2 | 2/2016 | Ahn et al. |

(Continued)

FOREIGN PATENT DOCUMENTS

| GB | 2439118 A | 12/2007 |
| KR | 10-0552451 B1 | 2/2006 |

(Continued)

OTHER PUBLICATIONS

Extended European Search Report, application No. 18173388.2 , dated Sep. 21, 2018, 7 pages.

*Primary Examiner* — Ryan A Lubit
(74) *Attorney, Agent, or Firm* — Innovation Counsel LLP

(57) ABSTRACT

A touch sensor includes: a plurality of sensor pixels; a sensor scan driver for supplying sensor scan signals to the sensor pixels through sensor scan lines; a power supply unit for supplying common voltages to the sensor pixels through common lines; and a read-out circuit connected to the sensor pixels through the common lines, the read-out circuit configured to sense a touch by using an output signal output through the common lines, wherein two sensor pixels adjacent to each other among the sensor pixels share one common line.

17 Claims, 10 Drawing Sheets

(51) Int. Cl.
　　　*G06F 3/047*　　　(2006.01)
　　　*G06K 9/00*　　　(2006.01)
　　　*H01L 27/32*　　　(2006.01)
　　　*G09G 3/3258*　　　(2016.01)

(52) U.S. Cl.
　　　CPC ......... *G06K 9/0002* (2013.01); *G09G 3/3258* (2013.01); *H01L 27/3276* (2013.01); *G06F 2203/04112* (2013.01)

(56) References Cited

U.S. PATENT DOCUMENTS

| | | | |
|---|---|---|---|
| 9,679,182 B2 | 6/2017 | Bae et al. | |
| 2011/0316809 A1* | 12/2011 | Kim | G06F 3/0412 345/174 |
| 2014/0176494 A1* | 6/2014 | Huang | G02F 1/13394 345/174 |
| 2015/0035766 A1 | 2/2015 | Chung | |
| 2015/0227247 A1* | 8/2015 | Wu | G02F 1/1333 345/175 |
| 2016/0132177 A1* | 5/2016 | Bae | G06K 9/00013 345/174 |
| 2016/0132713 A1* | 5/2016 | Bae | G06K 9/0014 345/174 |
| 2016/0357310 A1 | 12/2016 | Wang et al. | |
| 2017/0003777 A1 | 1/2017 | Akhavan Foman et al. | |
| 2017/0017340 A1 | 1/2017 | Liu et al. | |
| 2017/0351364 A1* | 12/2017 | Kim | G06K 9/001 |
| 2018/0275793 A1* | 9/2018 | Hamaguchi | G06F 3/0446 |

FOREIGN PATENT DOCUMENTS

| | | |
|---|---|---|
| KR | 10-2016-0057285 A | 5/2016 |
| WO | 2010088653 A2 | 8/2010 |

* cited by examiner

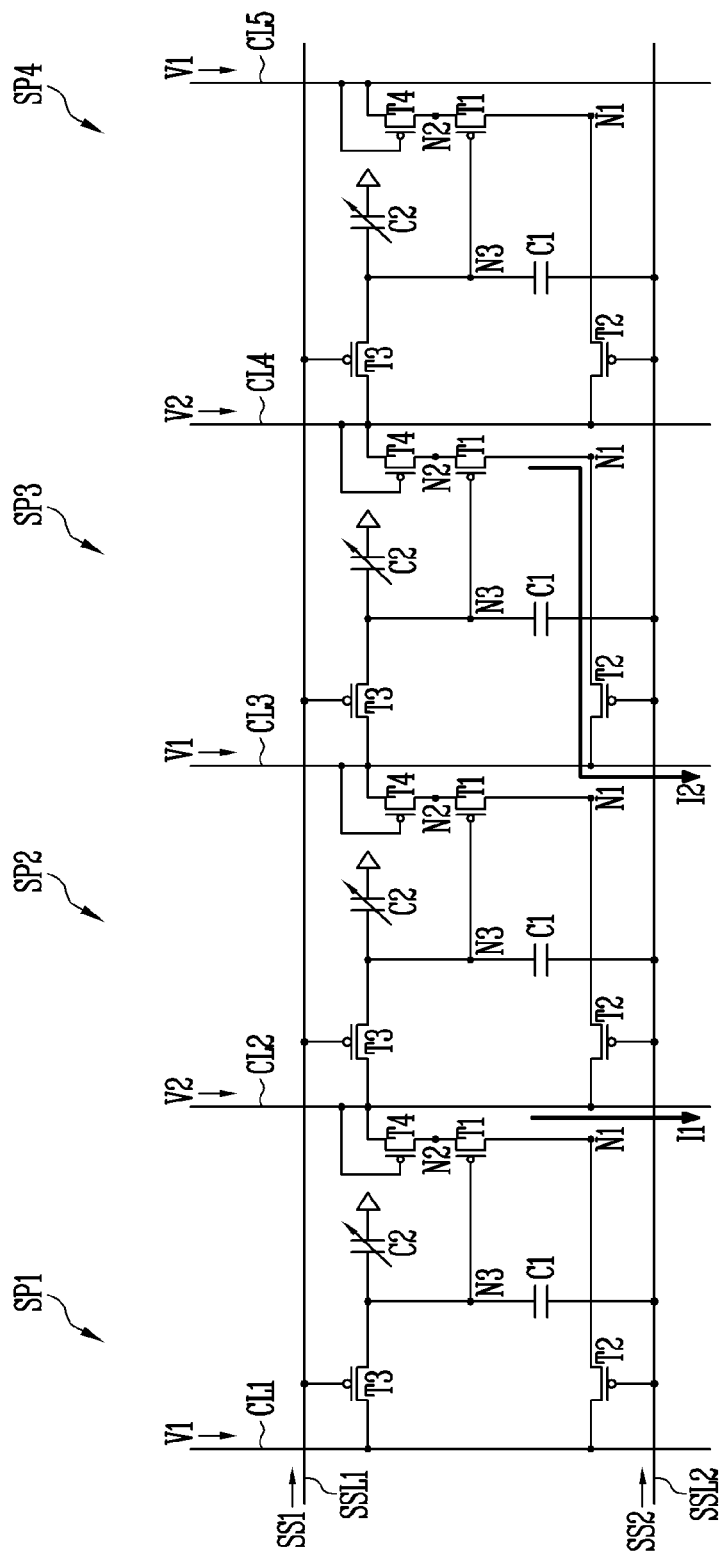

TOUCH SENSOR AND DISPLAY DEVICE INCLUDING THE SAME

RELATED APPLICATIONS

The present application is a continuation application of U.S. patent application Ser. No. 15/983,427 filed on May 18, 2018, which claims priority under 35 USC § 119 to Korean Patent Application No. 10-2017-0064114, filed on May 24, 2017, in the Korean Intellectual Property Office, the entire disclosures of which are incorporated by reference herein.

BACKGROUND

1. Field

An aspect of the present disclosure relates to a touch sensor and a display device including the same.

2. Description of the Related Art

Various recognition methods including an optical method, a thermal sensing method, a capacitive method, and the like are known as methods for implementing a touch sensor. Among these methods, a capacitive touch sensor senses a point at which capacitance is changed as a hand of a user or an object is in contact therewith, thereby detecting a touch position. Since the capacitive touch sensor easily senses a multi-touch and has excellent accuracy, the capacitive touch sensor has recently been widely used.

Recently, various functions have been provided to users by detecting not only touch positions but also fingerprints and touch pressures, using touch sensors.

A capacitive fingerprint sensor acquires a shape of a fingerprint (a fingerprint pattern) by detecting changes in capacitance depending on shapes of the ridges and valleys in a fingerprint when a surface of a human finger comes into contact with a conductive sensing electrode.

SUMMARY

Embodiments provide a miniaturized and integrated touch sensor for touch and fingerprint sensing and a display device including the touch sensor.

According to an aspect of the present disclosure, there is provided a touch sensor including: a plurality of sensor pixels; a sensor scan driver configured to supply sensor scan signals to the sensor pixels through sensor scan lines; a power supply unit configured to supply common voltages to the sensor pixels through common lines; and a read-out circuit connected to the sensor pixels through the common lines, the read-out circuit configured to sense a touch by using an output signal output through the common lines, wherein two sensor pixels adjacent to each other among the sensor pixels share one common line.

One sensor pixel between the two sensor pixels may provide the output signal to the read-out circuit during only a first period in one frame period, and the other sensor pixel between the two sensor pixels may provide the output signal to the read-out circuit during only a second period different from the first period in the one frame period.

The power supply unit may alternately provide a first common voltage and a second common voltage having a level lower than that of the first common voltage to each of the common lines for every certain period.

The power supply unit may simultaneously provide the common voltages having levels different from each other to odd-numbered common lines and even-numbered common lines among the common lines.

A first sensor pixel between the two sensor pixels may be connected to a jth (j is a natural number) common line and a (j+1)th common line, and a second sensor pixel between the two sensor pixels may be connected to the (j+1)th common line and a (j+2)th common line.

During a first period in one frame period, the power supply unit may supply a first common voltage to the jth and (j+2)th common lines, and supply a second common voltage having a level lower than that of the first common voltage to the (j+1)th common line. During a second period in the one frame period, the power supply unit may supply the second common voltage to the jth and (j+2)th common lines, and supply the first common voltage to the (j+1)th common line.

The first period and the second period may not overlap with each other.

The first sensor pixel may provide the output signal to the read-out circuit during the first period.

When the output signal is provided through the jth common line, the read-out circuit may determine that a touch has been generated on the first sensor pixel.

When the output signal is provided through the (j+1)th common line, the read-out circuit may determine that any touch has not been generated on the first sensor pixel.

The second sensor pixel may provide the output signal to the read-out circuit during the second period.

A sensor pixel connected to a jth common line, a (j+1)th common line, an ith (i is a natural number) sensor scan line, and an (i+1)th sensor scan line among the sensor pixels may include: a sensor electrode; a first transistor having a gate electrode connected to the sensor electrode, a first electrode connected to a first node, and a second electrode connected to a second node; a second transistor having a gate electrode connected to the (i+1)th sensor scan line, a first electrode connected to the jth common line, and a second electrode connected to the first node; a third transistor having a gate electrode connected to the ith sensor scan line, a first electrode connected to the jth common line, and a second electrode connected to the sensor electrode; and a fourth transistor having a first electrode connected to the second node, and a gate electrode and a second electrode, which are connected to the (j+1)th common line.

The sensor pixel may further include a capacitor electrode that forms a first capacitor together with the sensor electrode.

When the touch is generated, the sensor electrode may form a second capacitor together with a finger of a user.

When the sensor scan signal is supplied to the (i+1)th sensor scan line, the sensor pixel may provide the output signal to the read-out circuit.

According to another aspect of the present disclosure, there is provided a touch sensor including: a plurality of sensor pixels; a sensor scan driver configured to supply sensor scan signals to the sensor pixels through sensor scan lines; a power supply unit configured to supply common voltages to the sensor pixels through common lines; and a read-out circuit connected to the sensor pixels through the common lines, the read-out circuit configured to sense a touch by using an output signal output through the common lines, wherein a sensor pixel connected to a jth (j is a natural number), a (j+1)th common line, an ith (i is a natural number) sensor scan line, and an (i+1)th sensor scan line among the sensor pixels includes: a sensor electrode; a first transistor having a gate electrode connected to the sensor electrode, a first electrode connected to a first node, and a second electrode connected to a second node; a second transistor having a gate electrode connected to the (i+1)th sensor scan line, a first electrode connected to the jth common line, and a second electrode connected to the first node; a third transistor having a gate electrode connected to the ith sensor scan line, a first electrode connected to the jth common line, and a second electrode connected to the sensor electrode; and a fourth transistor having a first electrode connected to the second node, and a gate electrode and a second electrode, which are connected to the (j+1)th common line.

The sensor pixel may be activated when a first common voltage is supplied to the jth common line, and a second common voltage having a level lower than that of the first common voltage is supplied to the (j+1)th common line. The sensor pixel may be non-activated when the second common voltage is supplied to the jth common line and, the first common voltage is supplied to the (j+1)th common line.

When the sensor pixel is activated, and a touch of a user is generated on the sensor pixel, the output signal may be provided to the read-out circuit through the jth common line via the first, second, and fourth transistors.

When the sensor pixel is activated, and the touch of the user is not generated on the sensor pixel, the output signal may be provided to the read-out circuit through the (j+1)th common line.

According to still another aspect of the present disclosure, there is provided a display device including: display pixels configured to display an image; a plurality of sensor pixels disposed on the display pixels; a sensor scan driver configured to supply sensor scan signals to the sensor pixels through sensor scan lines; a power supply unit configured to supply common voltages to the sensor pixels through common lines; and a read-out circuit connected to the sensor pixels through the common lines, the read-out circuit configured to sense a touch by using an output signal output through the common lines, wherein two sensor pixels adjacent to each other among the sensor pixels share one common line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a circuit diagram illustrating operations of sensor pixels according to an embodiment of the present disclosure.

DETAILED DESCRIPTION

Figure 1:
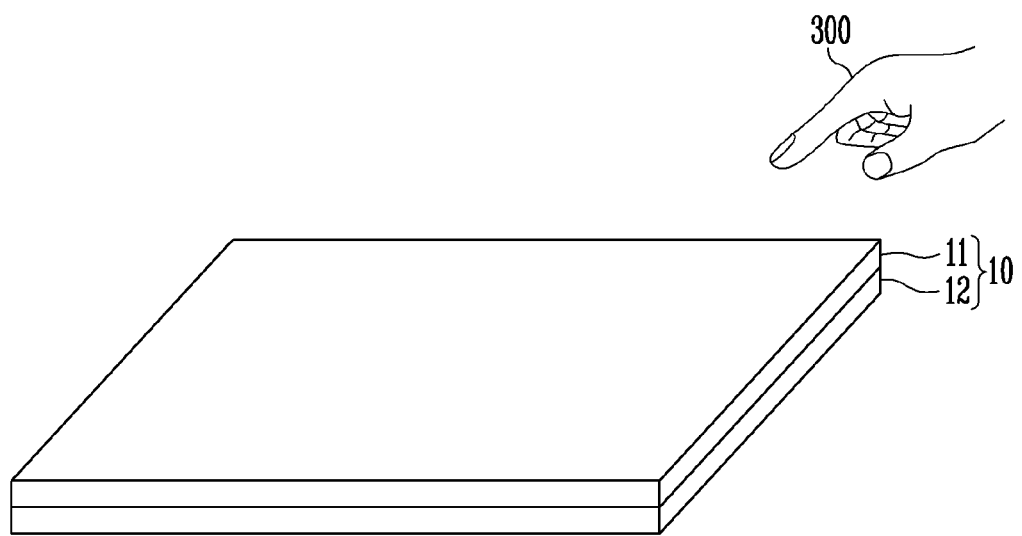
FIG. 1 is a view illustrating a display device according to an embodiment.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~between," "immediately~between" or "adjacent to~" and "directly adjacent to~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains.

The terms having the definitions as defined in the dictionary should be understood such that they have meanings consistent with the context of the related technique. So far as not being clearly defined in this application, terms should not be understood in an ideally or excessively formal way.

FIG. 1 is a view illustrating a display device according to an embodiment.

Referring to FIG. 1, the display device 10 according to the embodiment of the present disclosure may include a display panel 12 that display an image and a touch sensing layer 11 disposed on one surface of the display panel 12.

The display device 10 may be provided in a rectangular plate shape having two pairs of sides parallel to each other. When the display device 10 is provided in the rectangular plate shape, any one pair of sides among the two pairs of sides may be provided longer than the other pair of sides. However, the present disclosure is not limited thereto, and the display device 10 may be provided in various shapes such as a circular shape and a rectangular shape including curved corners.

The display panel 12 may display, on one surface thereof, visual information, e.g., text, a video, a picture, a two-dimensional or three-dimensional image, etc., and the visual information may be displayed as an "image." The kind of the display panel 12 is not particularly limited to ones that display images.

The touch sensing layer 11 may include a touch sensor that recognizes a touch event generated by a finger 300 of a user or a separated input means. The touch sensor is used to sense a touch and/or a pressure by using sensing electrodes, and the kind of the touch sensor is not particularly limited. For example, the touch sensor may be implemented using a capacitive method, a piezoresistive method, or the like.

Figure 2:
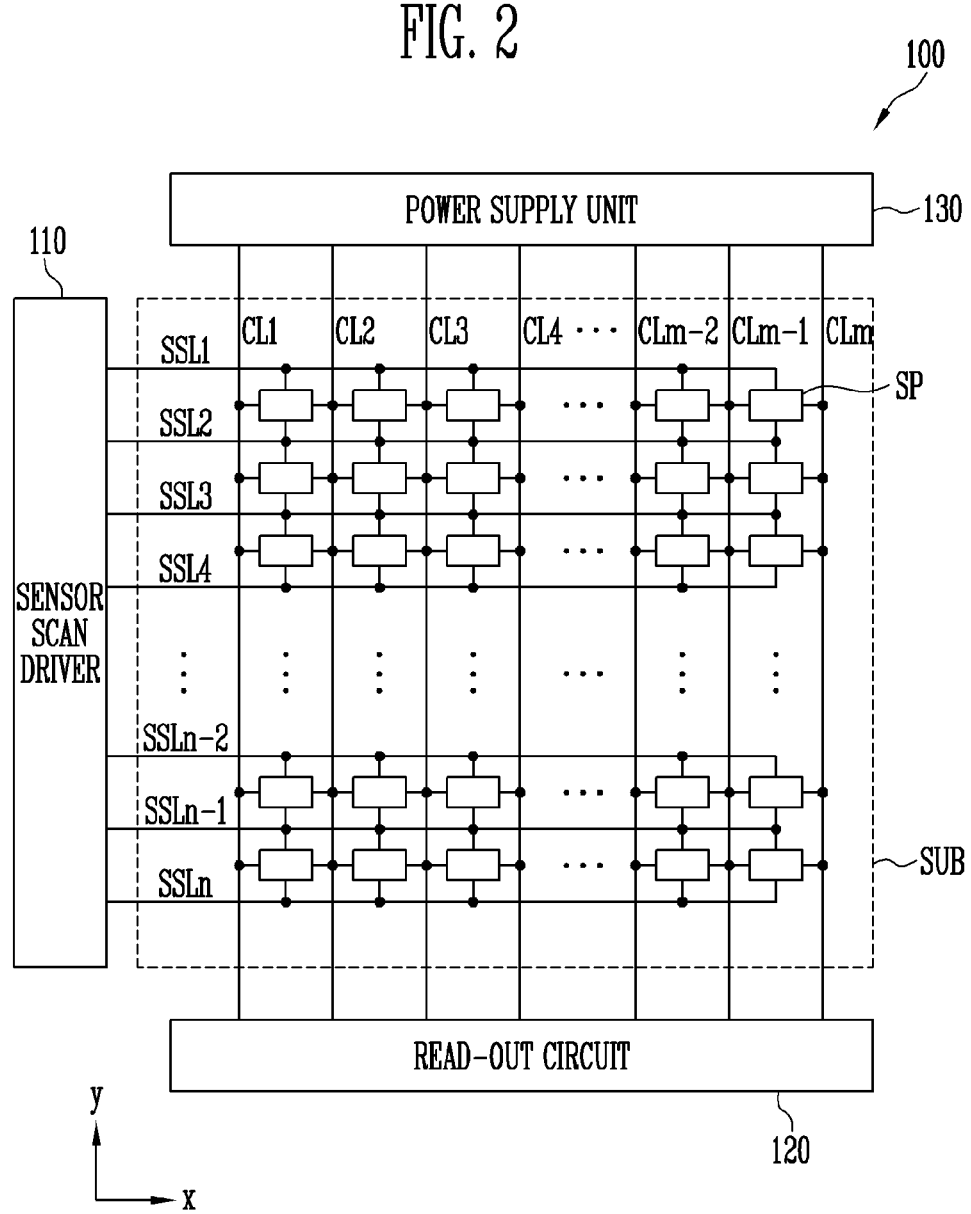
FIG. 2 is a view illustrating a touch sensor according to an embodiment of the present disclosure.
Figure 3:
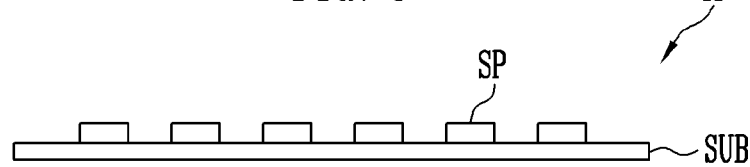
FIG. 3 is a view illustrating a partial section of the touch sensor shown in FIG. 2.

FIG. 2 is a view illustrating a touch sensor according to an embodiment of the present disclosure. FIG. 3 is a view illustrating a partial section of the touch sensor shown in FIG. 2.

Referring to FIGS. 2 and 3, the touch sensor 100 according to the embodiment of the present disclosure may recognize a touch input by a user.

For example, a recognizing operation implementable by the touch sensor 100 may include at least one of identification of a position at which a touch is generated, recognition of a fingerprint of a touched finger, and sensing of a touch pressure.

The touch sensor 100 may include a substrate SUB, sensor pixels SP, a sensor scan driver 110, a read-out circuit 120, and a power supply unit 130.

The substrate SUB may be made of an insulative material such as glass or resin. Also, the substrate SUB may be made of a material having flexibility to be bendable or foldable. The substrate SUB may have a single- or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the substrate SUB may be variously changed, and the substrate SUB may be made of fiber glass reinforced plastic (FRP), or the like.

The sensor pixels SP may be located on the substrate SUB. Also, the sensor pixels SP may be connected to sensor scan lines SSL1 to SSLn and common lines CL1 to CLm.

The sensor pixels SP may receive sensor scan signals input through the sensor scan lines SSL1 to SSLn. The sensor pixels SP may output a predetermined output current corresponding to a touch state to some of the common lines CL1 to CLm during a supply period of the sensor scan signal.

In particular, two sensor pixel columns adjacent to each other among the sensor pixels SP may share one common line (any one of CL1 to CLm). In this case, the two sensor pixel columns are not simultaneously activated, and only one sensor pixel column corresponding to the supply of a common voltage may be activated for touch sensing.

For example, one sensor pixel column between the two sensor pixel columns may provide an output current to the read-out circuit 120 during only a first period in one frame period, and the other sensor pixel column may provide the output current to the read-out circuit 120 during only a second period different from the first period in the one frame period.

The sensor scan lines SSL1 to SSLn may be provided on the substrate SUB. The sensor scan lines SSL1 to SSLn may extend in a first direction (e.g., an x-axis direction) to be connected to the sensor pixels SP in units of sensor pixel rows.

In particular, at least two sensor pixel rows among the sensor pixel rows may be connected to the same sensor scan line (one of SSL1 to SSLn), and simultaneously receive a sensor scan signal input from the sensor scan line (the one of SSL1 to SSLn).

The common lines CL1 to CLm may be located on the substrate SUB. The common lines CL1 to CLm may extend in a second direction (e.g., a y-axis direction) to be connected to the sensor pixels SP in units of lines.

In particular, at least two sensor pixel columns among sensor pixel columns may be connected to the same common line (one of CL1 to CLm), and simultaneously receive a common voltage supplied from the common line (the one of CL1 to CLm). That is, adjacent sensor pixel columns may share one common line (one of CL1 to CLm).

In addition, the sensor pixels SP may provide an output current to the read-out circuit 120 through some of the common lines CL1 to CLm, corresponding to a touch of the user.

Meanwhile, the arrangement direction of the common lines CL1 to CLm may be variously changed. For example, the common lines CL1 to CLm may be disposed in parallel to the sensor scan lines SSL1 to SSLn.

The sensor scan driver 110 may supply sensor scan signals to the sensor pixels SP through the sensor scan lines SSL1 to SSLn.

In some embodiments, the sensor scan driver 110 may sequentially output sensor scan signals to the sensor scan lines SSL1 to SSLn.

The sensor scan signal may have a voltage level at which a transistor supplied with the sensor scan signal can be turned on.

The sensor scan driver 110 may be directly mounted on the substrate SUB, or be connected to the substrate SUB through a separate component such as a flexible printed circuit board.

The read-out circuit 120 may receive an output current from the sensor pixels SP through the common lines CL1 to CLm.

For example, when the sensor scan driver 110 sequentially supplies a sensor scan signal, the sensor pixels SP may be selected in units of lines, and the read-out circuit 120 may sequentially receive an output current received from the selected sensor pixels SP through the common lines CL1 to CLm.

In this case, if an output current is supplied from a first common line between two common lines connected to one sensor pixel SP, the read-out circuit 120 may determine that a touch has been generated on the corresponding sensor pixel SP.

On the other hand, if the output current is supplied from a second common line between the two common lines connected to the one sensor pixel SP, the read-out circuit 120 may determine that no touch has been generated on the corresponding sensor pixel SP.

Here, the first common line refers to a line to which a common voltage having a first voltage level (hereinafter, referred to as a first common voltage) is supplied, and the second common line refers to a line to which a common voltage having a second voltage level lower than the first voltage level (hereinafter, referred to as a second common voltage) is supplied.

By using the determined result, the read-out circuit 120 may generate information on the position of a touch occurring on the sensor pixels SP, a pressure applied by the touch, valleys and ridges included in a fingerprint of a finger, and the like.

The read-out circuit 120 may be directly mounted on the substrate SUB, or be connected to the substrate SUB through a separate component such as a flexible printed circuit board.

The power supply unit 130 may supply common voltages to the sensor pixels SP through the common lines CL1 to CLm. In this case, the power supply unit 130 may supply the first common voltage to some common lines among the common lines CL1 to CLm, and supply the second common voltage to the other common lines.

For example, the power supply unit 130 may supply the first common voltage or the second common voltage to odd-numbered common lines CL1, CL3, . . . , and supply the second common voltage or the first common voltage to even-numbered common lines CL2, CL4, . . . . That is, the power supply unit 130 may simultaneously supply common voltages having different voltage levels to the odd-numbered common lines CL1, CL3, . . . and the even-numbered common lines CL2, CL4, . . . .

In addition, the power supply unit 130 may alternately supply the first common voltage and the second common voltage to each of the common lines CL1 to CLm for every certain period.

For example, during a first period in one frame period, the power supply unit 130 may supply the first common voltage the odd-numbered common lines CL1, CL3, . . . , and supply the second common voltage to the even-numbered common lines CL2, CL4, . . . . After that, during a second period not overlapping with the first period in the one frame period, the power supply unit 130 may supply the second common voltage the odd-numbered common lines CL1, CL3, . . . , and supply the first common voltage to the even-numbered common lines CL2, CL4, . . . .

In FIG. 2, it is illustrated that the sensor scan driver 110, the read-out circuit 120, and the power supply unit 130 are individually provided, but at least some of the components may be integrated, if necessary.

In addition, the sensor scan driver 110, the read-out circuit 120, and the power supply unit 130 may be installed in various ways such as chip on glass, chip on plastic, tape carrier package, and chip on film.

Figure 4:
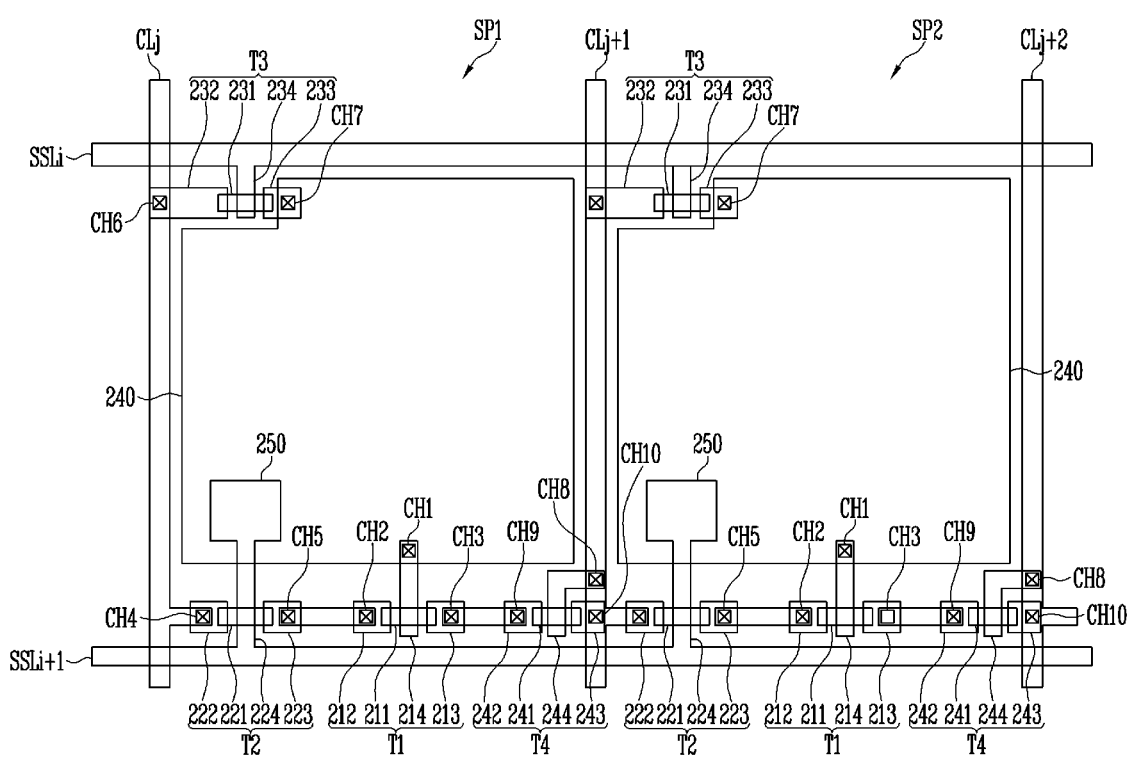
FIG. 4 is a plan view of sensor pixels according to an embodiment of the present disclosure.

FIG. 4 is a plan view of sensor pixels according to an embodiment of the present disclosure.

For convenience of description, a first sensor pixel SP1 connected to ith and (i+1)th sensor scan lines SSLi and SSLi+1 and jth and (j+1)th common lines CLj and CLj+1 and a second sensor pixel SP2 connected the ith and (i+1)th sensor scan lines SSLi and SSLi+1 and the (j+1)th common line CLj+1 and a (j+2)th common line CLj+2 are illustrated in FIG. 4 (here, i and j are natural numbers).

Referring to FIG. 4, each of the first and second sensor pixels SP1 and SP2 according to the embodiment of the present disclosure may include a sensor electrode 240, a first transistor T1, a second transistor T2, a third transistor T3, a fourth transistor T4, and a capacitor electrode 250.

Hereinafter, only connection relationships between components included in the first sensor pixel SP1 will be described in detail to avoid redundancy.

The first transistor T1 may control an output current flowing in the jth common line CLj. To this end, the first transistor T1 may be connected between the second transistor T2 and the fourth transistor T4.

For example, the first transistor T1 may include a first electrode connected to a second electrode 223 of the second transistor T2, a second electrode 213 connected to a first electrode 242 of the fourth transistor T4, a gate electrode 214 connected to the sensor electrode 240, and a semiconductor layer 211 connected between the first electrode 212 and the second electrode 213.

In addition, the gate electrode 214, the first electrode 212, and the second electrode 213 of the first transistor T1 may be connected to other components through contact holes CH1, CH2, and CH3, respectively.

Therefore, the first transistor T1 may control an output current output to the jth common line CLj, corresponding to the potential of the sensor electrode 240.

The second transistor T2 may be connected between the jth common line CLj and the first transistor T2.

For example, the second transistor T2 may include a first electrode 222 connected to the jth common line CLj, the second electrode 223 connected to the first electrode 212 of the first transistor T1, a gate electrode 224 connected to the (i+1)th sensor scan line SSLi+1, and a semiconductor layer 221 connected between the first electrode 222 and the second electrode 223.

In addition, the first electrode 222 and the second electrode 223 of the second transistor T2 may be connected to other components through contact holes CH4 and CH5, respectively.

Therefore, the second transistor T2 may be turned on when a sensor scan signal is supplied to the (i+1)th sensor scan line SSLi+1. When the second transistor T2 is turned on, the first common voltage or the second common voltage may be applied to the first electrode 212 of the first transistor T1.

The third transistor T3 may be connected between the jth common line CLj and the sensor electrode 240.

For example, the third transistor T3 may include a first electrode 232 connected to the jth common line CLj, a second electrode 233 connected to the sensor electrode 240, a gate electrode 234 connected to the ith sensor scan line SSLi, and a semiconductor layer 231 connected between the first electrode 232 and the second electrode 233.

In addition, the first electrode 232 and the second electrode 233 of the third transistor T3 may be connected to other components through contact holes CH6 and CH7, respectively.

Therefore, the third transistor T3 may be turned on when a sensor scan signal is supplied to the ith sensor scan line SSLi. When the third transistor T3 is turned on, the voltage of the sensor electrode 240 may be initialized to the first common voltage or the second common voltage.

The fourth transistor T4 may be connected between the first transistor T1 and the (j+1)th common line CLj+1.

For example, the fourth transistor T4 may include the first electrode 242 connected to the second electrode 213 of the first transistor T1, a second electrode 243 and a gate electrode 244, which are connected to the (j+1)th common line CLj+1, and a semiconductor layer 241 connected between the first electrode 242 and the second electrode 243.

In addition, the first electrode 242, the second electrode 243, and the gate electrode 244 of the fourth transistor T4 may be connected to other components through contact holes CH8, CH9, and CH10, respectively.

Therefore, the fourth transistor T4 may be turned on when the first common voltage is supplied to the first electrode 242 and the second common voltage is supplied to the (j+1)th common line CLj+1. That is, the fourth transistor T4 may be turned on when the first common voltage supplied to the jth common line CLj is supplied to the first electrode 242 via the first transistor T1 and the second common voltage is supplied to the (j+1)th common line CLj+1.

On the other hand, the fourth transistor T4 may be turned off when the second common voltage is supplied to the first electrode 242 and the first common voltage is supplied to the (j+1)th common line CLj+1. That is, the fourth transistor T4 may be turned off when the second common voltage supplied to the jth common line CLj is supplied to the first electrode 242 via the first transistor T1 and the first common voltage is supplied to the (j+1)th common line CLj+1.

When the fourth transistor T4 is turned on, the first transistor T1 may provide an output current to the jth common line CLj, corresponding to the potential of the sensor electrode 240.

The capacitor electrode 250 may be located to overlap with the sensor electrode 240. Accordingly, the capacitor electrode 250 can form a first capacitor together with the sensor electrode 240.

In addition, the capacitor electrode 250 may be connected to the ith sensor scan line SSLi. For example, the capacitor electrode 250 may be connected to the ith sensor scan line SSLi through the gate electrode 224 of the second transistor T2.

In this case, the capacitor electrode 250 and the gate electrode 224 of the second transistor T2 may be formed of the same material as the ith sensor scan line SSLi.

The sensor electrode 240 may form a capacitor together with the capacitor electrode 250. In addition, the sensor electrode 240 may form a capacitor, corresponding to a touch of a finger or the like.

In addition, the sensor electrode 240 may include a conductive material.

For example, the conductive material may include at least one of metals, any alloy thereof, a conductive polymer, and a transparent conductive material.

For example, the metal may include at least one of copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, and lead.

For example, the conductive polymer may include at least one of polythiophene-based, polypyrrole-based, polyaniline-based, polyacetylene-based, and polyphenylene-based compounds, and mixtures thereof. In particular, a polythiophene-based compound made of a PEDOT/PSS compound may be used as the conductive polymer.

For example, the transparent conductive material may include at least one of silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube (CNT), and graphene.

Meanwhile, the first sensor pixel SP1 and the second sensor pixel SP2 may share the (j+1)th common line CLj+1. That is, the fourth transistor T4 of the first sensor pixel SP1 and the second and third transistors T2 and T3 of the second sensor pixel SP2 may be connected to the (j+1)th common line CLj+1. Therefore, when the first common voltage or the second common voltage is supplied to the (j+1)th common line CLj+1, the first sensor pixel SP1 and the second sensor pixel SP2 may be simultaneously supplied with the first common voltage or the second common voltage.

Figure 5A:
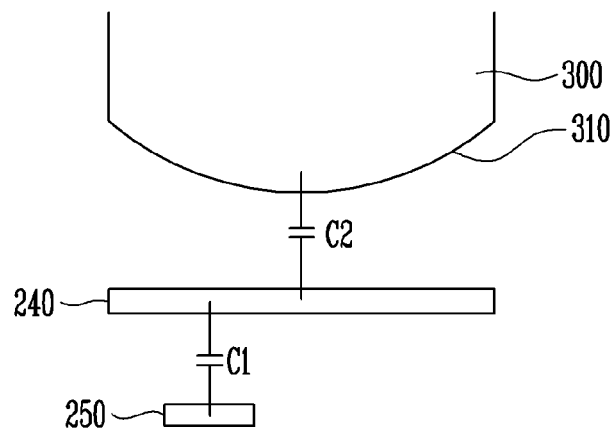
FIGS. 5A and 5B are views illustrating capacitances of capacitors, changed depending on ridges and valleys of a fingerprint.
Figure 5B:
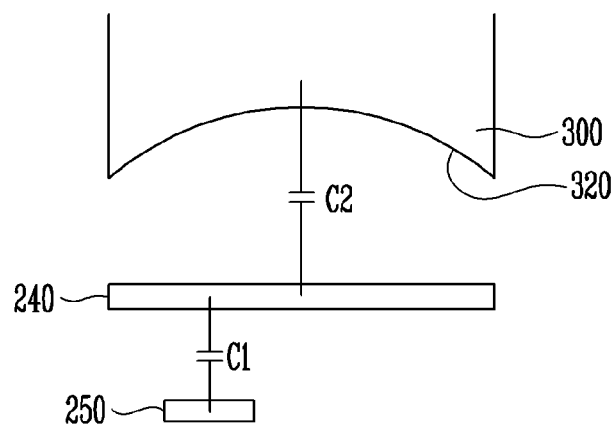

FIGS. 5A and 5B are views illustrating capacitances of capacitors, changed depending on ridges and valleys of a fingerprint. In particular, a case where a ridge 310 of a fingerprint of a finger 300 is located on a sensor pixel SP is illustrated in FIG. 5A, and a case where a valley 320 of the finger print of the finger 300 is located on the sensor pixel SP is illustrated in FIG. 5B.

Referring to FIGS. 5A and 5B, a sensor electrode 240 and a capacitor electrode 250 may form a first capacitor C1. The sensor electrode 240 and the capacitor electrode 250 may be located to be spaced apart from each other, and a least one insulating layer (not shown) may be located between the sensor electrode 240 and the capacitor electrode 250.

In addition, when the finger 300 of the user is located on the sensor pixel SP so as to recognize the fingerprint, the sensor electrode 240 and the finger 300 may form a second capacitor C2.

In this case, the second capacitor C2 is a variable capacitor, and the capacitance of the second capacitor C2 may be changed depending on whether the ridge 310 or the valley 320 of the fingerprint is located on the sensor electrode 240.

That is, since a distance between the ridge 310 and the sensor electrode 240 is shorter than that between the valley 320 and the sensor electrode 240, a capacitance of the second capacitor C2 when the ridge 310 is located on the sensor electrode 240 as shown in FIG. 5A may be different from that of the second capacitor C2 when the valley 320 is located on the sensor electrode 240 as shown in FIG. 5B.

A change in capacitance of the second capacitor C2 has influence on an output current of the sensor pixel SP, and thus the read-out circuit 120 can recognize the fingerprint of the user by sensing a variation of the output current.

Figure 6:
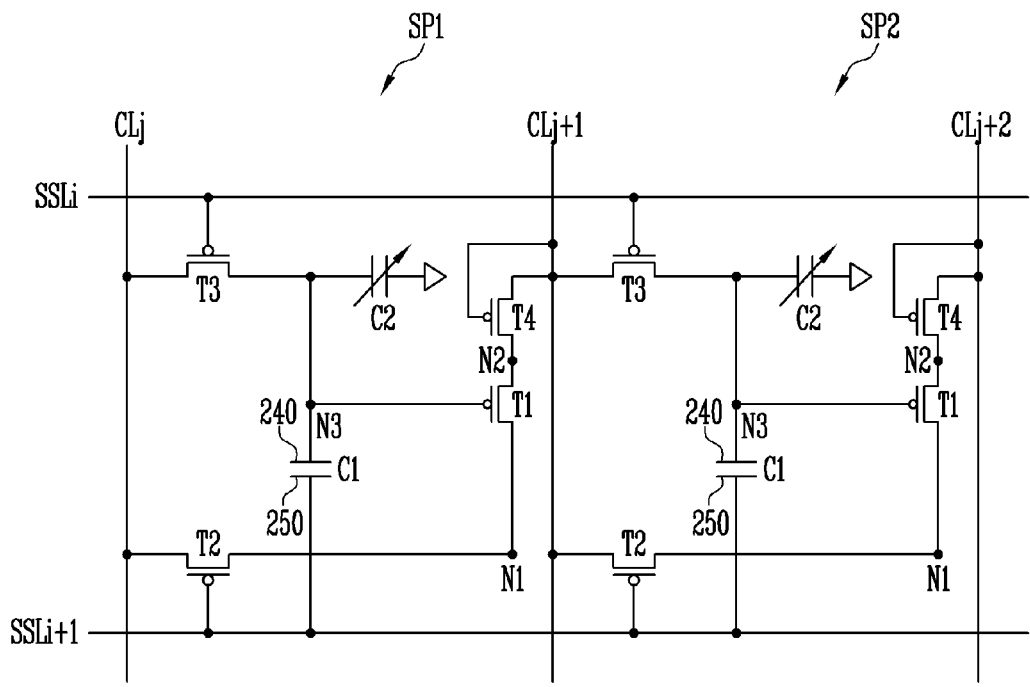
FIG. 6 is a circuit diagram illustrating an embodiment of sensor pixels shown in FIG. 2.
Figure 7:
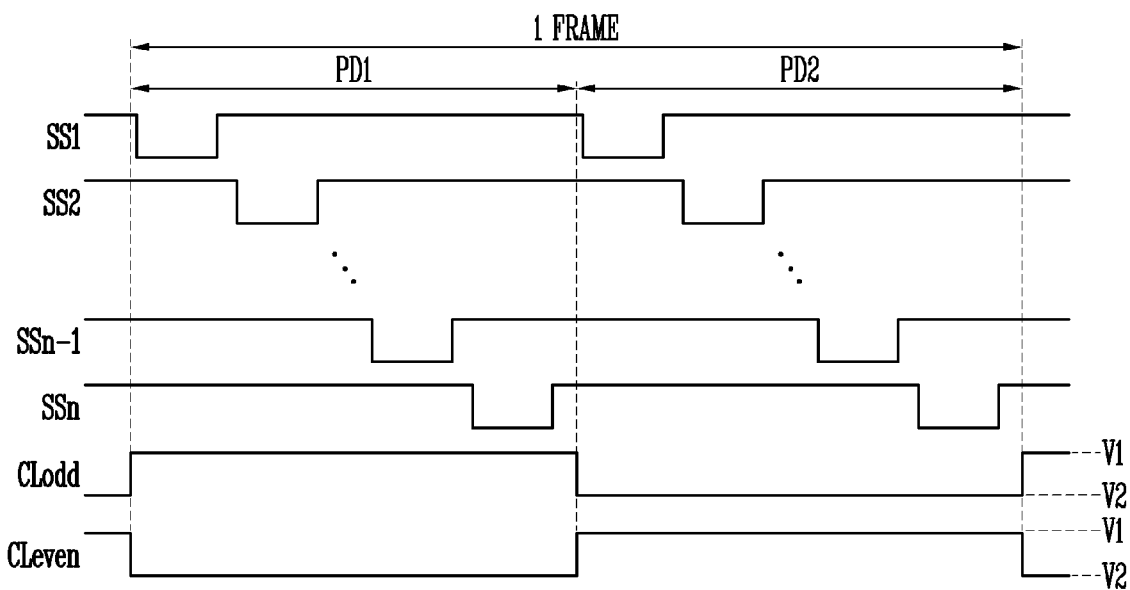
FIG. 7 is a timing diagram illustrating an operation of the sensor pixel shown in FIG. 6.

FIG. 6 is a circuit diagram illustrating an embodiment of the sensor pixels shown in FIG. 2. FIG. 7 is a timing diagram illustrating an operation of the sensor pixel shown in FIG. 6.

For convenience of description, a first sensor pixel SP1 connected to ith and (i+1)th sensor scan lines SSLi and SSLi+1 and jth and (j+1)th common lines CLj and CLj+1 and a second sensor pixel SP2 connected the ith and (i+1)th sensor scan lines SSLi and SSLi+1 and the (j+1)th common line CLj+1 and a (j+2)th common line CLj+2 are illustrated in FIG. 6.

In addition, a first sensor scan signal SS1 supplied to a first sensor scan lines SSL1 to an nth sensor scan signal SSn supplied to an nth sensor scan line SSLn are illustrated in FIG. 7, and a common voltage CLodd to the odd-numbered common lines CL1, CL3, . . . and a common voltage CLeven supplied to the even-numbered common lines CL2, CL4, . . . are illustrated in FIG. 7.

Each of the first and second sensor pixels SP1 and SP2 may include a first capacitor C1, a first transistor T1, a second transistor T2, a third transistor T3, and a fourth transistor T4.

Hereinafter, only connection relationships between components included in the first sensor pixel SP1 will be described in detail to avoid redundancy.

As described above, the first capacitor C1 may be formed a sensor electrode 240 connected to the third node N3 and a capacitor electrode 250 connected to the (i+1)th sensor scan line SSLi+1.

In addition, a second capacitor C2 is a variable capacitor, and may be formed by the sensor electrode 240 and the finger 300 of the user as described above. In this case, the capacitance of the second capacitor C2 may be changed depending on a distance between the sensor electrode 240 and the finger 300, whether a ridge or valley of the fingerprint is located on the sensor electrode 240, the intensity of a pressure generated by a touch, or the like.

The first transistor T1 may include a first electrode connected to a first node N1, a second electrode connected to a second node N2, and a gate electrode connected to the third node N3.

The second transistor T2 may include a first electrode connected to the jth common line CLj, a second electrode connected to the first node N1, and a gate electrode connected to the (i+1)th sensor scan line SSLi+1.

The third transistor T3 may include a first electrode connected to the jth common line CLj, a second electrode connected to the third node N3, and a gate electrode connected to the ith sensor scan line SSLi.

The fourth transistor T4 may include a first electrode connected to the second node N2, and a second electrode and a gate electrode, which are connected to the (j+1)th common line CLj+1.

Here, the first node N1 is a node to which the first electrode of the first transistor T1 and the second electrode of the second transistor T2 are commonly connected, the second node N2 is a node to which the second electrode of the first transistor T1 and the first electrode of the fourth transistor T4 are commonly connected, and the third node N3 is a node to which the sensor electrode 240, the gate electrode of the first transistor T1, and the second electrode of the third transistor T3 are commonly connected.

Here, the first electrode of each of the transistors T1, T2, T3, and T4 may be set as any one of source and drain electrodes, and the second electrode of each of the transistors T1, T2, T3, and T4 may be set as an electrode different from the first electrode. For example, if the first electrode is set as a source electrode, the second electrode may be set as a drain electrode.

In FIG. 6, a case where the transistors T1, T2, T3, and T4 are PMOS transistors is illustrated as an example. However, in another embodiment, the transistors T1, T2, T3, and T4 may be implemented as NMOS transistors.

Referring to FIG. 7, there are illustrated first to nth sensor scan signals SS1 to SSn supplied during a first period PD1 and a second period PD2 in one frame period 1 FRAME, a common voltage CLodd supplied to the odd-numbered common lines CL1, CL3, . . . , and a common voltage CLeven supplied to the even-numbered common lines CL2, CL4, . . . .

Here, the one frame period 1 FRAME may mean a period in which the sensor scan signals SS1 to SSn are supplied to all sensor pixels at least twice, or mean a period corresponding to one period of a vertical synchronization signal supplied to the display panel 12.

The first to nth sensor signals SS1 to SSn may be sequentially supplied to first to nth sensor scan lines SSL1 to SSLn during the first period PD1, and be repeatedly supplied to the first to nth sensor scan lines SSL1 to SSLn during the second period PD2 not overlapping with the first period PD1.

In addition, the common voltage CLodd having a first voltage level V1 may be supplied to the odd-numbered common lines CL1, CL3, . . . during the first period PD1, and the common voltage CLodd having a second voltage level V2 may be supplied to the odd-numbered common lines CL1, CL3, . . . during the second period PD2.

In addition, the common voltage CLeven having the second voltage level V2 may be supplied to the even-numbered common lines CL2, CL4, . . . during the first period PD1, and the common voltage CLeven having the first voltage level V1 may be supplied to the even-numbered common lines CL2, CL4, . . . during the second period PD2.

Accordingly, during the first period PD1, the common voltage CLodd having the first voltage level V1 may be supplied to the first electrode of the second transistor T2 and the first electrode of the third transistor T3 on an odd-numbered sensor pixel column, and the common voltage CLeven having the second voltage level V2 may be supplied to the second electrode of the fourth transistor T4 on the odd-numbered sensor pixel column.

Hereinafter, operations of the first sensor pixel SP1 and the second sensor pixel SP2 will be described by assuming that the first sensor pixel SP1 is located on an odd-numbered sensor pixel column and the second sensor pixel SP2 is located on an even-numbered sensor pixel column.

If an ith sensor scan signal SSi is supplied during the first period PD1, the third transistor T3 of the first sensor pixel SP1 may be turned on such that the third node N3 is initialized to the first voltage level V1. In addition, the third transistor T3 of the second sensor pixel SP2 may be turned on such that the third node N3 is initialized to the second voltage level V2.

After that, if an (i+1)th sensor scan signal SSi+1 is supplied during the first period PD1, the second transistor T2 of the first sensor pixel SP1 may be turned on such that the common voltage CLodd having the first voltage level V1 is supplied to the first node N1. In addition, the second transistor T2 of the second sensor pixel SP2 may be turned on such that the common voltage CLeven having the second voltage level V2 is supplied to the first node N1.

In this case, the first transistor T1 may control the supply of an output current output corresponding to a gate voltage (a voltage applied to the third node N3), and the gate voltage of the first transistor T1 may be determined according to the following equation.

$$Vg = \{CA2/(CA1+CA2)\}*Vs$$

Here, Vg is a gate voltage, CA1 is a capacitance of the first capacitor C1, CA2 is a capacitance of the second capacitor C2, and Vs is a voltage variation of the (i+1)th scan signal SSi+1 supplied to the (i+1)th sensor scan line SSLi+1.

When a touch is generated by the user, the first transistor T1 may be turned on according to the equation. On the other hand, when any touch is not generated by the user, the first transistor T1 may be turned off according to the equation.

When the first transistor T1 of the first sensor pixel SP1 is turned on during the first period PD1, the common voltage CLodd having the first voltage level V1 may be supplied to the first electrode of the fourth transistor T4. In addition, when the first transistor T1 of the second sensor pixel SP2 is turned on, the common voltage CLeven having the second voltage level V2 may be supplied to the first electrode of the fourth transistor T4.

At this time, since the common voltage CLodd having the first voltage level V1 is supplied to the first electrode of the fourth transistor T4 of the first sensor pixel SP1 and the common voltage CLeven having the second voltage level V2 is supplied to the second electrode and the gate electrode of the fourth transistor T4, the fourth transistor T4 may be turned on. In this case, an output current may be provided to the jth common line CLj via the fourth, first, and second transistors T4, T1, and T2.

On the other hand, since the common voltage CLeven having the second voltage level V2 is supplied to the first electrode of the fourth transistor T4 of the second sensor pixel SP2 and the common voltage CLodd having the first voltage level V1 is supplied to the second electrode and the gate electrode of the fourth transistor T4, the fourth transistor T4 may be turned off. In this case, the second sensor pixel SP2 cannot provide any output current to the read-out circuit 120.

As described above, the odd-numbered sensor pixel column may be activated for touch sensing during the first period PD1, but the even-numbered sensor pixel column may be non-activated.

After that, during the second period PD2, the common voltage CLodd having the second voltage level V2 may be supplied to the first electrode of the second transistor T2 and the first electrode of the third transistor T3 on the odd-numbered sensor pixel column, and the common voltage CLeven having the first voltage level V1 may be supplied to the second electrode of the fourth transistor T4.

In addition, during the second period PD2, the common voltage CLeven having the first voltage level V1 may be supplied to the first electrode of the second transistor T2 and the first electrode of the third transistor T3 on the even-numbered sensor pixel column, and the common voltage CLodd having the second voltage level V2 may be supplied to the second electrode of the fourth transistor T4.

The first sensor pixel SP1 may perform the same operation as the second sensor pixel SP2 during the first period, and the second sensor pixel SP2 may perform the same operation as the first sensor pixel SP1 during the first period. Hereinafter, overlapping descriptions will be omitted.

Consequently, during the second period PD2, the odd-numbered sensor pixel columns are non-activated, and the even-numbered sensor pixel columns are activated for touch sensing.

As described above, in the touch sensor 100 according to the embodiment of the present disclosure, the odd-numbered sensor pixel columns can be activated during the first period PD1 in the one frame period 1 FRAME, and the even-numbered sensor pixel columns can be activated during the second period PD2.

Meanwhile, although a case where the first period PD1 in the one frame period 1 FRAME precedes the second period PD2 is illustrated in FIG. 7, the present disclosure is not limited thereto, and the second period PD2 may precede the first period PD1. That is, during the one frame period 1 FRAME, the even-numbered sensor pixel columns may be first activated, and the odd-numbered sensor pixel columns may be then activated.

In addition, although a case where one first period PD1 and one second period PD2 exist in the one frame period 1 FRAME is illustrated in FIG. 7, the present disclosure is not limited thereto, and a plurality of first periods PD1 and a plurality of second periods PD2 may exist in the one frame period 1 FRAME.

FIG. 8 is a circuit diagram illustrating operations of sensor pixels according to an embodiment of the present disclosure.

Referring to FIG. 8, there are illustrated first to fourth sensor pixels SP1 to SP4 commonly connected to first and second sensor scan lines SSL1 and SSL2. The first sensor pixel SP1 is connected to the first and second common lines CL1 and CL2, the second sensor pixel SP2 is connected to the second and third common lines CL2 and CL3, the third sensor pixel SP3 is connected to the third and fourth common lines CL3 and CL4, and the fourth sensor pixel SP4 is connected to the fourth and fifth common lines CL4 and CL5.

In addition, a common voltage having the first voltage level V1 may be supplied to the first, third, and fifth common lines CL1, CL3, and CL5, and a common voltage having the second voltage level V2 may be supplied to the second and fourth common lines CL2 and CL4.

Accordingly, the first and third sensor pixels SP1 and SP3 are activated for touch sensing, but the second and fourth sensor pixels SP2 and SP4 may be non-activated.

In FIG. 8, arrows are illustrated to describe a route of an output current changed depending on whether a touch is generated by the user. Hereinafter, a case where any touch is not generated on the first sensor pixel SP1 and a case where a touch is generated on the third sensor pixel SP3 are described to be distinguished from each other. However, this is merely an embodiment for convenience of description, and the embodiment of the present disclosure is not limited thereto.

Meanwhile, when an output current is supplied from a common line connected to the second and third transistors T2 and T3 of an activated sensor pixel, the read-out circuit 120 may determine that a touch has been generated on the corresponding sensor pixel. In addition, when an output current is supplied from a common line connected to the fourth transistor T4 of an activated sensor pixel, the read-out circuit 120 may determine that any touch has not been generated on the corresponding sensor pixel. That is, the read-out circuit 120 may determine the generation of a touch, based on whether the output current is supplied from the common line connected to the fourth transistor T4 of the activated sensor pixel.

First, although the second sensor scan signal SS2 is supplied to the gate electrode of the second transistor T2 of the first sensor pixel SP1, any touch has not been generated on the first sensor pixel SP1, and hence the first transistor T1 is turned off. Therefore, the output current of the first sensor pixel SP1 is provided to the read-out circuit 120 through the second common line CL2 without passing through the first transistor T1.

In addition, if the second sensor scan signal SS2 is supplied to the gate electrode of the second transistor T2 of the third sensor pixel SP3, a touch has been generated on the third sensor pixel SP3, and hence the first transistor T1 is turned on. Therefore, the output current of the third sensor pixel SP3 is provided to the third common line CL3 via the fourth, first, and second transistors T4, T1, and T2.

Consequently, the read-out circuit 120 may determine that any touch has not been generated on the first sensor pixel SP1 between the activated first and third sensor pixels SP1 and SP3, and a touch has been generated on the third sensor pixel SP3.

Figure 9A:
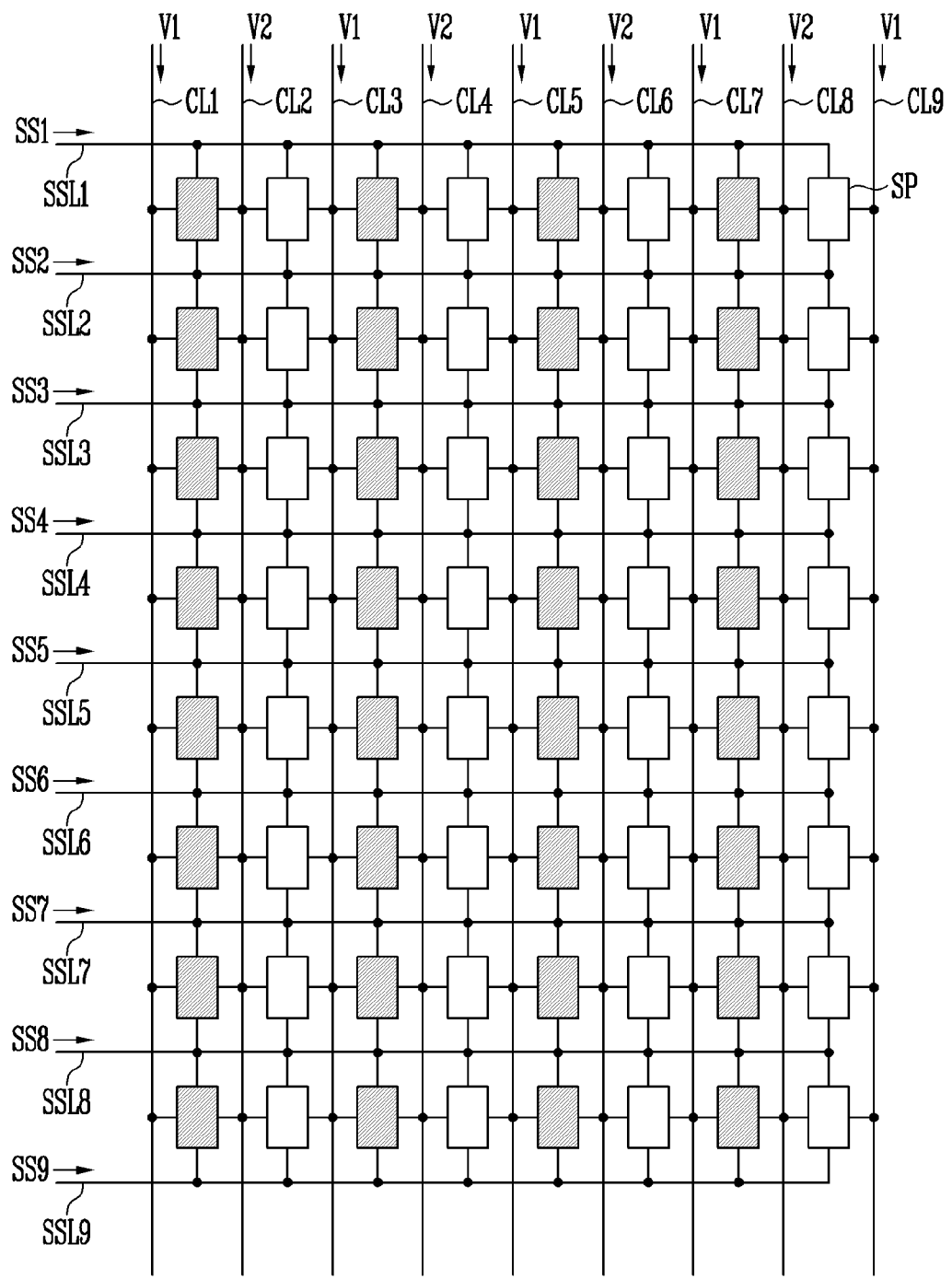
FIGS. 9A and 9B are conceptual views illustrating an operation of a touch sensor according to an embodiment of the present disclosure.
Figure 9B:
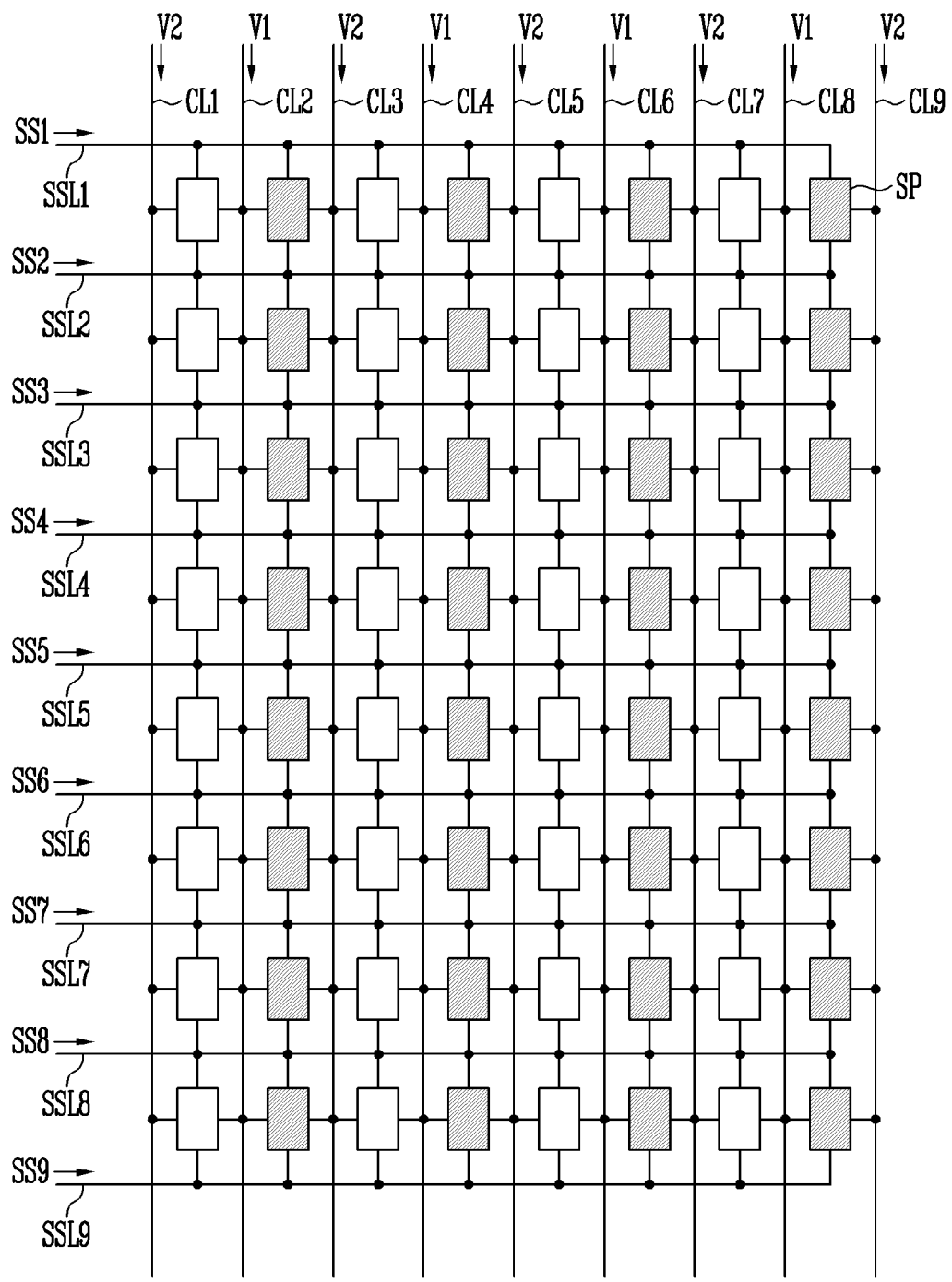

FIGS. 9A and 9B are conceptual views illustrating an operation of a touch sensor according to an embodiment of the present disclosure.

In FIGS. 9A and 9B, there are first to ninth sensor scan lines SSL1 to SSL9, first to ninth common lines CL1 to CL9, and sensor pixels SP having an 8×8 matrix structure. For convenience of description, this conceptually illustrates the touch sensor 100 shown in FIG. 2. The numbers, arrangements, etc. of the first to ninth sensor scan lines SSL1 to SSL9, the first to ninth common lines CL1 to CL9, and the sensor pixels SP having the 8×8 matrix structure are not limited thereto, and may be variously modified and implemented.

Meanwhile, some sensor pixels SP are displayed with black. However, the black is merely displayed to describe only activated sensor pixels, and does not connote any specific technical meaning.

Referring to FIG. 9A, the sensor scan driver 110 may be connected to the sensor pixels SP through the first to ninth scan lines SSL1 to SSL9, and the read-out circuit 120 and the power supply unit 130 may be connected to the sensor pixels SP through the first to ninth common lines CL1 to CL9.

In addition, sensor pixel columns adjacent to each other may share one common line. For example, a first sensor pixel column and a second sensor pixel column may be commonly connected to the second common line CL2.

As shown in FIG. 9A, if the common voltage having the first voltage level V1 is supplied to the odd-numbered common lines CL1, CL3, . . . , CL9 and the common voltage having the second voltage level V2 is supplied to the even-numbered common lines CL2, CL4, . . . , CL8, the odd-numbered sensor pixels may be activated for touch sensing, and the even-numbered sensor pixels may be non-activated.

Referring to FIG. 9B, if the common voltage having the second voltage level V2 is supplied to the odd-numbered common lines CL1, CL3, . . . , CL9 and the common voltage having the first voltage level V1 is supplied to the even-numbered common lines CL2, CL4, . . . , CL8, the odd-numbered sensor pixels may be non-activated, and the even-numbered sensor pixels may be activated for touch sensing.

As described above, the touch sensor 100 according to the embodiment of the present disclosure can control the sensor pixel SP to be activated by selectively supplying the common voltage having the first voltage level V1 or the second voltage level V2 to the common lines.

Figure 10:
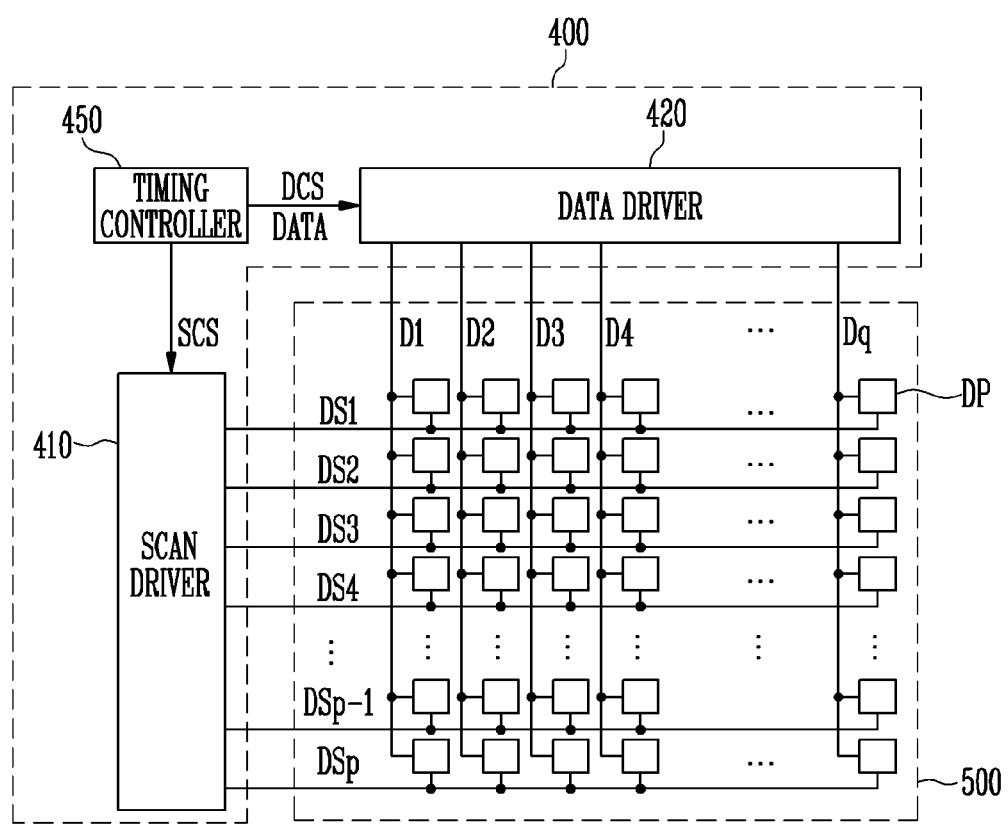
FIG. 10 is a view illustrating a display pixel unit and a display driving unit according to an embodiment of the present disclosure.

FIG. 10 is a view illustrating a display pixel unit and a display driving unit according to an embodiment of the present disclosure.

Referring to FIG. 10, the display panel 12 according to the embodiment of the present disclosure may include a display pixel unit 500 and a display driving unit 400.

The display pixel unit 500 may include a plurality of display pixels DP.

The display pixels DP may be connected to data lines D1 to Dq and display scan lines DS1 to DSp. For example, the display pixels DP may be arranged in a matrix form at intersection portions of the data lines D1 to Dq and the display scan lines DS1 to DSp.

In addition, each of the display pixels DP may be supplied with a data signal and a display scan signal through the data lines D1 to Dq and the display scan lines DS1 to DSp.

Each of the display pixels DP may include a light emitting device (e.g., an organic light emitting diode), and light corresponding to a data signal may be emitted from the display pixel DP by current flowing from a first power source ELVDD to a second power source ELVSS via the light emitting device.

The display driving unit 400 may include a scan driver 410, a data driver 420, and a timing controller 450.

The scan driver 410 may supply scan signals to the display scan lines DS1 to DSp in response to a scan driver control signal SCS. For example, the scan driver 410 may sequentially supply display scan signals to the display scan lines DS1 to DSp.

In order for the scan driver 410 to be connected to the display scan lines DS1 to DSp, the scan driver 410 may be directly mounted on a substrate or be connected to the substrate through a separate component such as a flexible printed circuit board.

The data driver 420 may receive a data driver control signal DCS and image data DATA, input from the timing controller 450, to generate a data signal.

The data driver 420 may supply the generated data signal to the data lines D1 to Dq.

In order for the data driver 420 to be connected to the data lines D1 to Dq, the data driver 420 may be directly mounted on the substrate or be connected to the substrate through a separate component such as a flexible printed circuit board.

If a display scan signal is supplied to a specific display scan line, some display pixels DP connected to the specific display scan line may be supplied with a data signal transmitted from the data lines D1 to Dq. The some display pixels DP may emit light with a luminance corresponding to the supplied data signal.

The timing controller 450 may generate control signals for controlling the scan driver 410 and the data driver 420. For example, the control signals may include the scan driver control SCS for controlling the scan driver 410 and the data driver control signal DCS for controlling the data driver 420.

In addition, the timing controller 450 may supply the scan driver control signal SCS to the scan driver 410, and supply the data driver control signal DCS to the data driver 420.

The timing controller 450 may convert image data DATA suitable for specifications of the data driver 420, and supply the converted image data to the data driver 420.

In FIG. 10, it is illustrated that the scan driver 410, the data driver 420, and the timing controller 450 are individually provided, but at least some of the components may be integrated, if necessary.

In addition, the scan driver 410, the data driver 420, and the timing controller 450 may be installed in various ways such as chip on glass, chip on plastic, tape carrier package, and chip on film.

Figure 11:
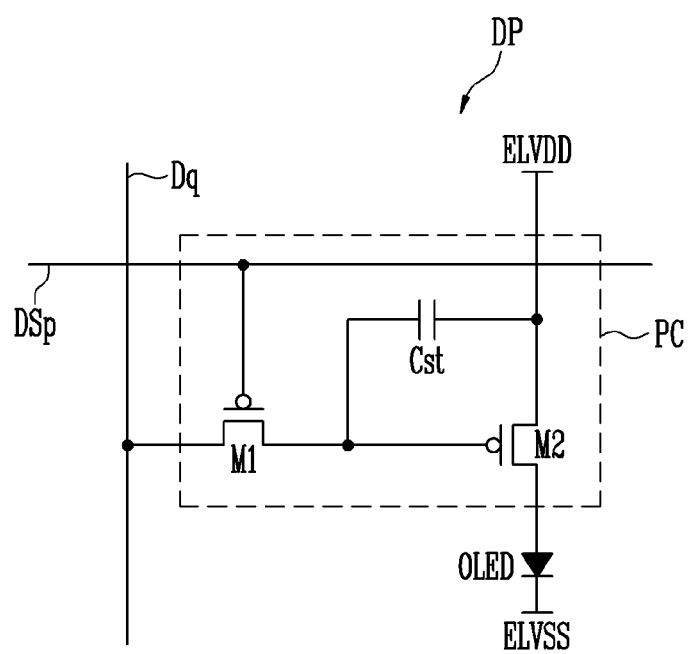
FIG. 11 is a view illustrating an embodiment of a display pixel shown in FIG. 10.

FIG. 11 is a view illustrating an embodiment of the display pixel shown in FIG. 10.

For convenience of illustration, a display pixel DP connected to a pth display scan line DSp and a qth data line Dq is illustrated in FIG. 11.

Referring to FIG. 11, the display pixel DP may include an organic light emitting diode OLED and a pixel circuit PC connected to the qth data line Dq, the pth display scan line DSp to control the organic light emitting diode OLED.

An anode electrode of the organic light emitting diode OLED may be connected to the pixel circuit PC, and a cathode electrode of the organic light emitting diode OLED may be connected to the second power source ELVSS.

The organic light emitting diode OLED may generate light with a predetermined luminance corresponding to a current supplied from the pixel circuit PC.

The pixel circuit PC may store a data signal supplied to the qth data line Dq when a display scan signal is supplied to the pth display scan line. The pixel circuit PC may control the amount of current supplied to the organic light emitting diode OLED, corresponding to the stored data signal.

For example, the pixel circuit PC may include a first transistor M1, a second transistor M2, and a storage capacitor Cst.

The first transistor M1 may be connected between the qth data line Dq and the second transistor M2.

For example, a gate electrode of the first transistor M1 may be connected to the pth display scan line DSp, a first electrode of the first transistor M1 may be connected to the qth data line Dq, and a second electrode of the first transistor M1 may be connected to a gate electrode of the second transistor M2.

The first transistor M1 may be turned on when the display scan signal is supplied to the pth display scan line DSp, to supply a data signal from the qth data line Dq to the storage capacitor Cst.

In this case, the storage capacitor Cst may charge a voltage corresponding to the data signal.

The second transistor M2 may be connected between the first power source ELVDD and the organic light emitting diode OLED.

For example, the gate electrode of the second transistor M2 may be connected to a first electrode of the storage capacitor Cst and the second electrode of the first transistor M1, a first electrode of the second transistor M2 may be connected to a second electrode of the storage capacitor Cst and the first power source ELVDD, and a second electrode of the second transistor M2 may be connected to the anode electrode of the organic light emitting diode OLED.

The second transistor M2 is a driving transistor, and may control the amount of current flowing from the first power source ELVDD to the second power source ELVDD via the organic light emitting diode OLED, corresponding to the voltage stored in the storage capacitor Cst.

In this case, the organic light emitting diode OLED may generate light corresponding to the amount of current supplied from the second transistor M2.

Here, the first electrode of each of the transistors M1 and M2 may be set as any one of source and drain electrodes, and the second electrode of each of the transistors M1 and M2 may be set as an electrode different from the first electrode. For example, if the first electrode is set as a source electrode, the second electrode may be set as a drain electrode.

In FIG. 11, a case where the transistors M1 and M2 are PMOS transistors is illustrated as an example. However, in another embodiment, the transistors M1 and M2 may be implemented as NMOS transistors.

In the touch sensor and the display device including the same according to the present disclosure, although a separate common voltage line and a separate output line are not disposed, a common voltage can be supplied to a sensor pixel through one common line, and an output current output from the sensor pixel can be sensed.

In the touch sensor and the display device including the same according to the present disclosure, the number of lines required to drive the touch sensor can be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A touch sensor comprising:
   a sensor scan driver connected to an ith (i is a natural number) sensor scan line and an (i+1)th sensor scan line;
   a power supply unit connected to a jth (j is a natural number) common line, a (j+1)th common line, and a (j+2)th common line;
   a read-out circuit connected to the jth common line, the (j+1)th common line, and the (j+2)th common line;
   a first sensor pixel connected to the jth common line, the (j+1)th common line, the ith sensor scan line, and the (i+1)th sensor scan line; and
   a second sensor pixel connected to the (j+1)th common line, the (j+2)th common line, the ith sensor scan line, and the (i+1)th sensor scan line.

2. The touch sensor of claim 1,
   wherein the first sensor pixel comprises a first selection transistor, and
   wherein the first selection transistor has a first electrode, a gate electrode connected to the (j+1)th common line, and a second electrode connected to the (j+1)th common line.

3. The touch sensor of claim 2,
   wherein the second sensor pixel comprises a second selection transistor, and
   wherein the second selection transistor has a first electrode, a gate electrode connected to the (j+2)th common line, and a second electrode connected to the (j+2)th common line.

4. The touch sensor of claim 2,
   wherein the first sensor pixel further comprises:
   a sensor electrode;
   a first transistor having a gate electrode connected to the sensor electrode,
   a first electrode connected to a first node, and a second electrode connected to a second node;
   a second transistor having a gate electrode connected to the (i+1)th sensor scan line, a first electrode connected to the jth common line, and a second electrode connected to the first node; and
   a third transistor having a gate electrode connected to the ith sensor scan line, a first electrode connected to the jth common line, and a second electrode connected to the sensor electrode, and
   wherein the first electrode of the first selection transistor is connected to the second node.

5. The touch sensor of claim 4,
   wherein the sensor scan driver is configured to supply sensor scan signals to the first and second sensor pixels through the ith and the (i+1)th sensor scan lines;
   wherein the power supply unit is configured to supply common voltages to the first and second sensor pixels through the jth, the (j+1)th, and the (j+2)th common lines; and
   wherein the read-out circuit is configured to sense a touch by using an output signal output through the jth, the (j+1)th, and the (j+2)th common lines.

6. The touch sensor of claim 5, wherein the first sensor pixel provides the output signal to the read-out circuit during only a first period in one frame period, and
   the second sensor pixel provides the output signal to the read-out circuit during only a second period different from the first period in the one frame period.

7. The touch sensor of claim 5, wherein the power supply unit alternately provides a first common voltage and a second common voltage having a level lower than that of the first common voltage to each of the jth, the (j+1)th, and the (j+2)th common lines for each detection period.

8. The touch sensor of claim 5, wherein the power supply simultaneously provides the common voltages having levels different from each other to odd-numbered common lines and even-numbered common lines among the jth, the (j+1)th, and the (j+2)th common lines.

9. The touch sensor of claim 5, wherein, during a first period in one frame period, the power supply unit supplies a first common voltage to the jth and (j+2)th common lines, and supplies a second common voltage having a level lower than that of the first common voltage to the (j+1)th common line, and wherein, during a second period in the one frame period, the power supply unit supplies the second common voltage to the jth and (j+2)th common lines, and supplies the first common voltage to the (j+1)th common line.

10. The touch sensor of claim 9, wherein the first period and the second period do not overlap with each other.

11. The touch sensor of claim 9, wherein the first sensor pixel provides the output signal to the read-out circuit during the first period.

12. The touch sensor of claim 11, wherein, when the output signal is provided through the jth common line, the read-out circuit determines that a touch has been generated on the first sensor pixel.

13. The touch sensor of claim 11, wherein, when the output signal is provided through the (j+1)th common line, the read-out circuit determines that a touch has not been generated on the first sensor pixel.

14. The touch sensor of claim 9, wherein the second sensor pixel provides the output signal to the read-out circuit during the second period.

15. The touch sensor of claim 5, wherein the first sensor pixel further includes a capacitor electrode that forms a first capacitor together with the sensor electrode.

16. The touch sensor of claim 5, wherein, when the touch is generated, the sensor electrode forms a second capacitor together with a finger of a user.

17. The touch sensor of claim 5, wherein, when the sensor scan signal is supplied to the (i+1)th sensor scan line, the first sensor pixel provides the output signal to the read-out circuit.

* * * * *